United States Patent
Kuntzman et al.

(10) Patent No.: US 10,362,408 B2
(45) Date of Patent: Jul. 23, 2019

(54) DIFFERENTIAL MEMS MICROPHONE

(71) Applicant: Knowles Electronics, LLC, Itasca, IL (US)

(72) Inventors: Michael Kuntzman, Chicago, IL (US); Wade Conklin, Chicago, IL (US); Sung Bok Lee, Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 42 days.

(21) Appl. No.: 15/424,598

(22) Filed: Feb. 3, 2017

(65) Prior Publication Data

US 2017/0230757 A1 Aug. 10, 2017

Related U.S. Application Data

(60) Provisional application No. 62/291,152, filed on Feb. 4, 2016.

(51) Int. Cl.
 *H04R 19/04* (2006.01)
 *B81B 3/00* (2006.01)
 *H04R 3/00* (2006.01)

(52) U.S. Cl.
 CPC .......... *H04R 19/04* (2013.01); *B81B 3/0021* (2013.01); *H04R 3/005* (2013.01); *H04R 2201/003* (2013.01); *H04R 2410/05* (2013.01)

(58) Field of Classification Search
 CPC .... H04R 19/04; H04R 3/005; H04R 2410/05; H04R 2201/003; B81B 3/0021
 USPC ........................................ 381/174
 See application file for complete search history.

(56) References Cited

U.S. PATENT DOCUMENTS

| | | |
|---|---|---|
| 5,490,220 A | 2/1996 | Loeppert |
| 7,190,038 B2 | 3/2007 | Dehe et al. |
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 7,961,897 B2 * | 6/2011 | Weigold ............... G01L 9/0042 381/174 |
| 8,737,171 B2 * | 5/2014 | Jenkins ................. B81B 3/0021 367/181 |

(Continued)

FOREIGN PATENT DOCUMENTS

EP 2 242 288 A1 10/2010

OTHER PUBLICATIONS

Invitation to Pay Additional Fees, PCT/US2017/016564, Knowles Electronics, LLC, 6 pages (Mar. 28, 2017).

(Continued)

*Primary Examiner* — Oyesola C Ojo
(74) *Attorney, Agent, or Firm* — Foley & Lardner LLP

(57) ABSTRACT

The present disclosure relates generally to microphones and related components. One example micro electro mechanical system (MEMS) motor includes a first diaphragm; a second diaphragm that is disposed in generally parallel relation to the first diaphragm, the first diaphragm and second diaphragm forming an air gap there between; and a back plate disposed in the air gap between and disposed in generally parallel relation to the first diaphragm and the second diaphragm.

14 Claims, 18 Drawing Sheets

(56) References Cited

U.S. PATENT DOCUMENTS

| | | | |
|---|---|---|---|
| 8,860,154 B2* | 10/2014 | Wang | H04R 19/04 257/254 |
| 8,921,957 B1* | 12/2014 | Zhang | H04R 1/04 257/416 |
| 8,989,411 B2* | 3/2015 | Hall | H04R 23/00 257/678 |
| 9,219,963 B2* | 12/2015 | Yang | H04R 19/005 |
| 9,456,284 B2* | 9/2016 | Morishita | H04R 19/005 |
| 9,628,886 B2* | 4/2017 | Dehe | H04R 1/08 |
| 2005/0207605 A1 | 9/2005 | Dehe et al. | |
| 2007/0278501 A1 | 12/2007 | MacPherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0126834 A1* | 5/2010 | Ikehashi | G11C 23/00 200/181 |
| 2010/0128914 A1 | 5/2010 | Khenkin | |
| 2010/0183181 A1 | 7/2010 | Wang | |
| 2010/0195864 A1 | 8/2010 | Lutz et al. | |
| 2010/0246877 A1 | 9/2010 | Wang et al. | |
| 2010/0284553 A1* | 11/2010 | Conti | B81B 7/0061 381/174 |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2015/0003659 A1 | 1/2015 | Theuss | |
| 2015/0129992 A1* | 5/2015 | Hur | H04R 19/04 257/416 |
| 2015/0189444 A1* | 7/2015 | Pan | H04R 19/04 381/173 |
| 2015/0256940 A1* | 9/2015 | Dehe | H04R 19/005 381/174 |
| 2015/0266723 A1* | 9/2015 | Chan | H04R 1/08 381/173 |
| 2016/0037263 A1* | 2/2016 | Pal | H04R 19/04 381/113 |
| 2016/0066099 A1* | 3/2016 | Dehe | B81B 3/0021 381/174 |
| 2016/0080871 A1* | 3/2016 | Zinn | H04R 19/04 381/369 |
| 2016/0142829 A1* | 5/2016 | Berger | H04R 23/00 381/174 |
| 2017/0289703 A1* | 10/2017 | Bartl | B81C 1/00158 |

OTHER PUBLICATIONS

International Search Report and Written Opinion, PCT/US2017/016564, Knowles Electronics, LLC, 20 pages (May 19, 2017).

* cited by examiner

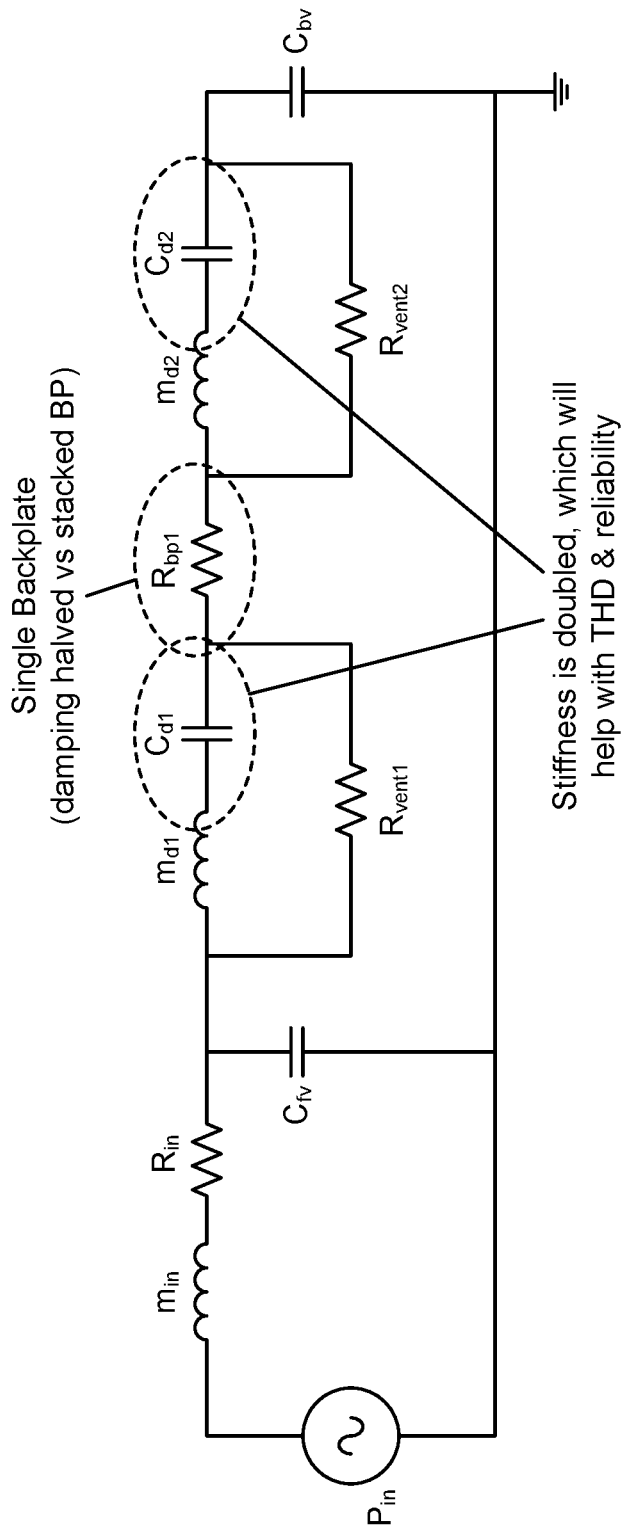
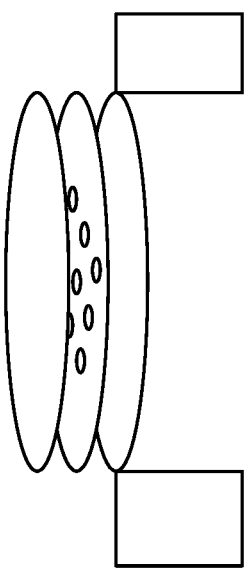
FIG. 3

DIFFERENTIAL MEMS MICROPHONE

CROSS-REFERENCE TO RELATED APPLICATIONS

The present application claims priority to and the benefit of U.S. Provisional Application No. 62/291,152 "DIFFERENTIAL MEMS MICROPHONE" filed Feb. 4, 2016, the contents of which are incorporated by reference herein in their entirety.

TECHNICAL FIELD

This application relates to microphones and, more specifically, to micro electro mechanical system (MEMS) that provide differential signals.

BACKGROUND

Different types of acoustic devices have been used through the years. One type of device is a microphone. In a microelectromechanical system (MEMS) microphone, a MEMS die includes a diaphragm and a back plate. The MEMS die is supported by a substrate and enclosed by a housing (e.g., a cup or cover with walls). A port may extend through the substrate (for a bottom port device) or through the top of the housing (for a top port device). In any case, sound energy traverses through the port, moves the diaphragm and creates a changing potential of the back plate, which creates an electrical signal. Microphones are deployed in various types of devices such as personal computers or cellular phones.

Differential signals are often desired by users. In one example, a first transducer obtains a first signal and a second transducer obtains a second signal. The signals are subtracted (or added) from each other to produce an output. The subtraction operation removes noise and other undesirable effects from the signals and can produce a larger and stronger signal. However, these approaches require the use of two transducers, which can be expensive and increase the size of the overall device.

As package sizes continue to shrink, it becomes more difficult to maintain high SNR performance within the smaller package size. As mentioned, dual parallel motor designs have been used but these cannot be used for very small package sizes.

The problems of previous approaches have resulted in some user dissatisfaction with these previous approaches.

SUMMARY

One aspect of the disclosure relates to a micro electro mechanical system (MEMS) motor. The MEMS motor comprises a first diaphragm, a second diaphragm, and a back plate. The second diaphragm is disposed in generally parallel relation to the first diaphragm, the first diaphragm and the second diaphragm forming an air gap there between. The back plate is disposed in the air gap between and in generally parallel relation to the first diaphragm and the second diaphragm.

Another aspect of the disclosure relates to a micro electro mechanical system (MEMS) microphone. The MEMS microphone comprises a base and a MEMS device disposed on the base. The MEMS device comprises a first diaphragm, a second diaphragm, and a back plate. The second diaphragm is disposed in generally parallel relation to the first diaphragm, the first diaphragm and the second diaphragm forming an air gap there between. The back plate is disposed in the air gap between and in generally parallel relation to the first diaphragm and the second diaphragm. The MEMS microphone further comprises a lid coupled to the base and enclosing the MEMS device. A port extends through either the base or the lid.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

Understanding that these drawings depict only several embodiments in accordance with the disclosure and are, therefore, not to be considered limiting of its scope, the disclosure will be described with additional specificity and detail through use of the accompanying drawings.

FIG. 3 is an electrical circuit diagram of a microphone/motor apparatus according to various embodiments of the present disclosure.

Figure 1:
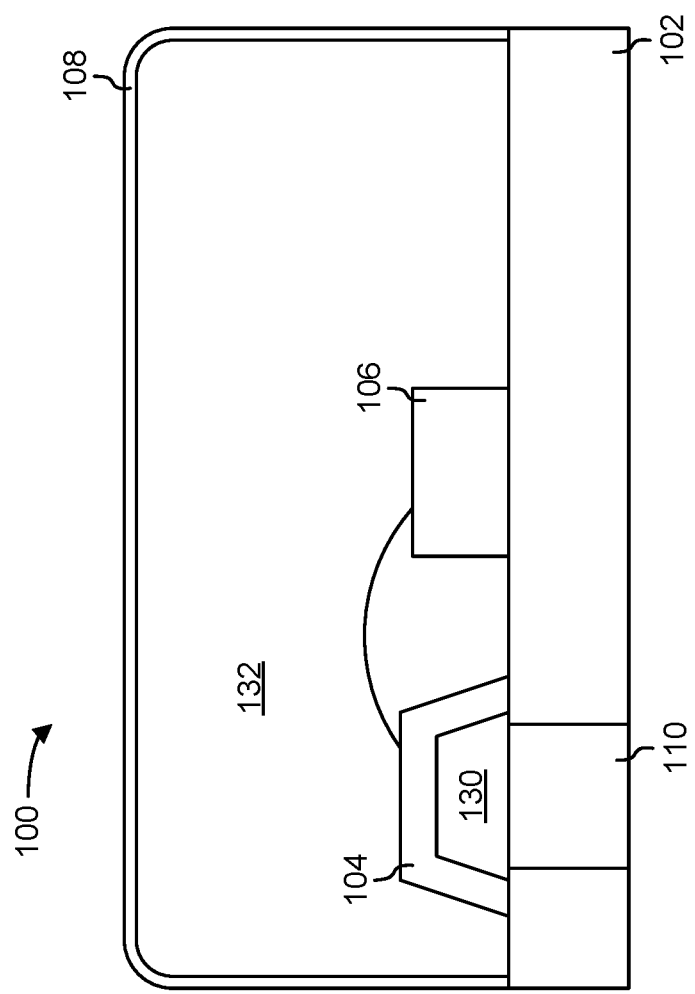
FIG. 1 is a side cut-away view of a microphone according to various embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure provides differential and compact dual diaphragm micro electro mechanical system (MEMS) motors. As used herein, "motor" includes the components that transform sound energy into an electrical signal such as the diaphragms and back plate. The disclosure herein provides better signal-to-noise ratio (SNR) performance in a smaller sized device as compared to previous approaches, according to various embodiments.

Referring now to FIG. 1, one example of a MEMS microphone 100 is described. The microphone 100 includes a base 102 (e.g., a printed circuit board), a micro electro mechanical system (MEMS) device 104 (including a diaphragm and a back plate), an integrated circuit 106 (e.g., an application specific integrated circuit), and a lid or cover 108 that encloses MEMS device 104 and integrated circuit 106. A port 110 extends through the base 102 making this a bottom port microphone. However, it will be appreciated that the port 110 may extend through the lid 108 making the microphone 100 a top port microphone.

A front volume 130 is formed on one side of the MEMS device 104 while a back volume 132 is formed on the other side of the MEMS device 104. Generally speaking, the back volume 132 is bounded by the lid 108, base 102, MEMS device 104, and integrated circuit 106. The front volume 130 generally includes the back hole of the MEMS device 104 and the port opening.

In one example, the MEMS device 104 includes a first diaphragm and a second diaphragm. The second diaphragm is disposed in generally parallel relation to the first diaphragm. The first and second diaphragms form an air gap there between. A back plate is disposed in the air gap between and in generally parallel relation to the first diaphragm and the second diaphragm. In this example, the first diaphragm is a free plate diaphragm that is free to move within first constraints disposed about the periphery of the first diaphragm. The second diaphragm is also a free plate diaphragm that is free to move within second constraints disposed about the periphery of the second diaphragm.

In some aspects, the first diaphragm is mechanically coupled to the second diaphragm across the air gap without the use of a mechanical coupler element. For instance, the air gap may be approximately 3-10 microns from the first diaphragm to the second diaphragm. Other examples are possible.

In some examples, a vent hole or multiple vent holes pierces the first diaphragm and/or the second diaphragm. Multiple, smaller vent holes may serve a dual function as release holes to help the oxide etchant enter the gap and free the structure at the end of the MEMS die fabrication process. In some examples, the first diaphragm has a top surface and a restraint (e.g., cover or lid) is configured to restrain at least some movement of the top surface of the first diaphragm.

In other examples, the MEMS device 104 includes a first diaphragm and a second diaphragm. The second diaphragm is disposed in generally parallel relation to the first diaphragm. The first and second diaphragms form an air gap there between. A back plate is disposed in the air gap between and in generally parallel relation to the first diaphragm and the second diaphragm. A vent hole or multiple vent holes are formed in at least one of the first diaphragm and the second diaphragm, and the vent hole is effective to provide air pressure equalization. The first diaphragm is mechanically coupled to the second diaphragm across the air gap without the use of a mechanical coupler element.

In some aspects, the air gap is approximately 3-10 microns from the first diaphragm to the second diaphragm. Other examples are possible.

In some examples, the first diaphragm and the second diaphragm are free plate diaphragms. In other examples, the first diaphragm has a top surface and the MEMS motor comprises a restraint that restrains at least some movement of the top surface of the first diaphragm. In some aspects, the first diaphragm has a first outer periphery and is constrained about the first outer periphery, and the second diaphragm has a second outer periphery and is constrained about the second outer periphery.

Figure 2:
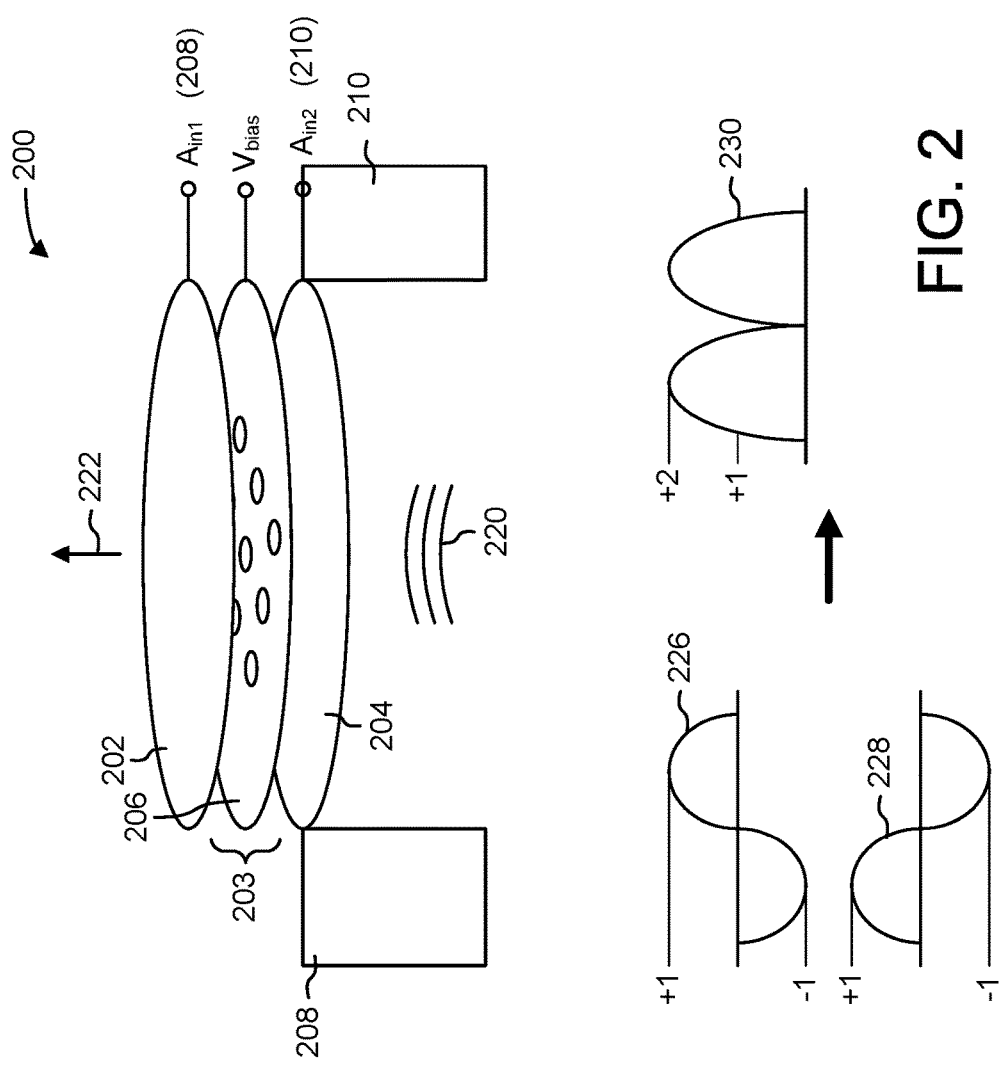
FIG. 2 is a view of a stacked motor according to various embodiments of the present disclosure.

Referring now to FIG. 2, a MEMS device or motor 200 includes a first diaphragm 202, a second diaphragm 204, a back plate 206, and a substrate 208. The second diaphragm 204 is disposed in generally parallel relation to the first diaphragm 202, and the first and second diaphragms 202, 204 form an air gap 203 there between. The back plate 206 is disposed in the air gap 203 between and in generally parallel relation to the first diaphragm 202 and the second diaphragm 204. In this example, the first diaphragm 202 is a free plate diaphragm that is free to move within first constraints (e.g., posts) disposed about the periphery of the first diaphragm 202. The second diaphragm 204 is also free plate diaphragm that is free to move within second constraints (e.g., posts) disposed about the periphery of the second diaphragm 204.

The diaphragms 202, 204 may be membranes and constructed of polysilicon. The back plate 206 may be constructed of silicon nitride. The back plate 206 is biased with a voltage Vbias. As the diaphragms 202, 204 move under sound pressure, leads 208 and 210 obtain voltage signals Ain1 and Ain2. Ain1 and Ain2 are differential signals. By "differential signals" and as used herein it is meant that the signals are similar in magnitude but opposite in polarity.

Advantageously, the example of FIG. 2 provides the same working capacitance as previous with the MEMS device being one-half as large. The structure of FIG. 2 provides an inherently differential voltage architecture. In some aspects, the example of FIG. 2 provides approximately 3 dB lower back plate acoustic damping noise compared to stacked back plate devices.

In operation, sound pressure 220 moves diaphragms 202, 204 in a direction indicated by arrow 222. This action produces a voltage waveform 226 at lead 208 and a voltage waveform 228 at lead 210. The two wave forms may be added to create waveform 230. The addition operation may be performed at the microphone or at an external consumer device.

Referring now to FIG. 3, a circuit diagram showing an acoustic lumped model of the approaches described herein is described (e.g., FIG. 2). FIG. 3 represents an equivalent acoustic circuit of the microphone/MEMS motor components.

In the example of FIG. 3, Pin is the incoming sound pressure; Rin is the viscosity of the air in the port (e.g., port 110 in FIG. 1); and Cfv is the compliance of the front cavity (compressability) of the port.

Md1 is the mass of the first diaphragm (e.g., diaphragm 202); Cd1 is the compliance of the first diaphragm (e.g., diaphragm 202) (i.e., how much it moves under sound pressure); and Rbp1 is the back plate damping (e.g., back plate 206 with air squeezing through holes in the back plate).

Rvent1 is the resistance of the vent in the first diaphragm (e.g., diaphragm 202). Rvent2 is the resistance of the vent in the second diaphragm (e.g., diaphragm 204). Md2 is the mass of the second diaphragm (e.g., diaphragm 204).

Min is mass of the air in the port (e.g., port 110 in FIG. 1). Cd2 is the compliance of the second diaphragm (e.g., diaphragm 204). Cbv is the compliance of the back volume of the microphone.

Compared to previous approaches, the stiffness of the diaphragm is doubled because two diaphragms are used. This may improve linearity, total harmonic distortion (THD), and the reliability of the microphone in some instances. Additionally, having one back plate dampens resistance and in some aspects provides one half of damping compared to previous approaches.

Figure 4:
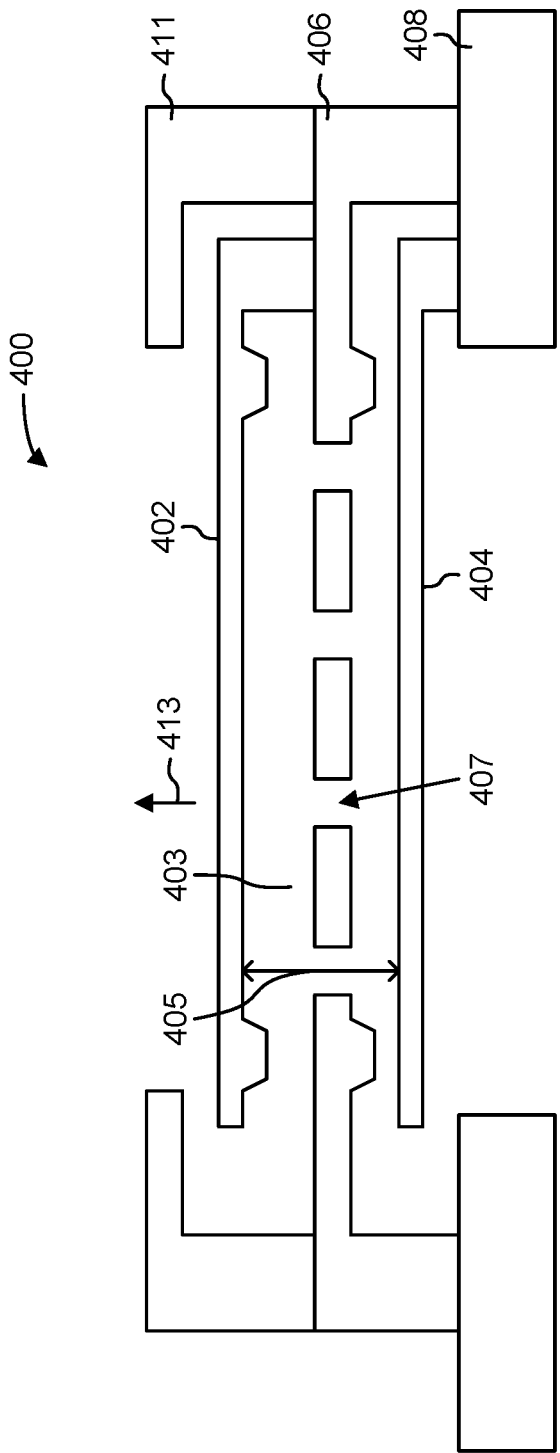
FIG. 4 is a side view of a MEMS motor according to various embodiments of the present disclosure.

Referring now to FIG. 4, a MEMS device or motor 400 includes a first diaphragm 402, a second diaphragm 404, a back plate 406 (with holes 407), and a substrate 408. The second diaphragm 404 is disposed in generally parallel relation to the first diaphragm 402 and the first and second diaphragm 402, 404 form an air gap 403 there between. The back plate 406 is disposed in the air gap 403 between and in generally parallel relation to the first diaphragm 402 and the second diaphragm 404. In this example, the first diaphragm 402 is a free plate diaphragm that is free to move within first constraints (e.g., posts) disposed about the periphery of the first diaphragm 402. The second diaphragm 404 is also free plate diaphragm that is free to move within second constraints (e.g., posts) disposed about the periphery of the second diaphragm 404.

The diaphragms 402, 404 may be membranes and constructed of polysilicon. The back plate 406 may be constructed of silicon nitride. The back plate 406 is biased with a voltage Vbias. As the diaphragms 402, 404 move under sound pressure, separate leads (not shown) on each of the diaphragms 402, 404 obtain voltage signals, which are differential signals. Vents that are configured and sized to provide pressure equalization may also extend through one or both of the diaphragms 402, 404.

A lid or restraining structure 411 constructed, for example, of polysilicon may be disposed on top of the back plate 406. The lid structure 411 limits motion of the first diaphragm 402 (in the direction indicated by the arrow labeled 413) and prevents blow out of the MEMS device 404.

The air gap 403 has a distance 405 (e.g., 3-10 microns). This distance is selected to be very small so that the stiffness of air trapped in the gap 403 is very high (above some predetermined threshold). This configuration ensures that the diaphragms 402, 404 will displace the same amount, even if the compliance of the diaphragms 402, 404 is not well matched. The total effective compliance will be the sum of the compliance of each of the diaphragms. This improves total harmonic distortion (THD) and the reliability of the microphone. Having one back plate dampens resistance, and in some aspects provides one half of damping compared to previous approaches.

Figure 5:
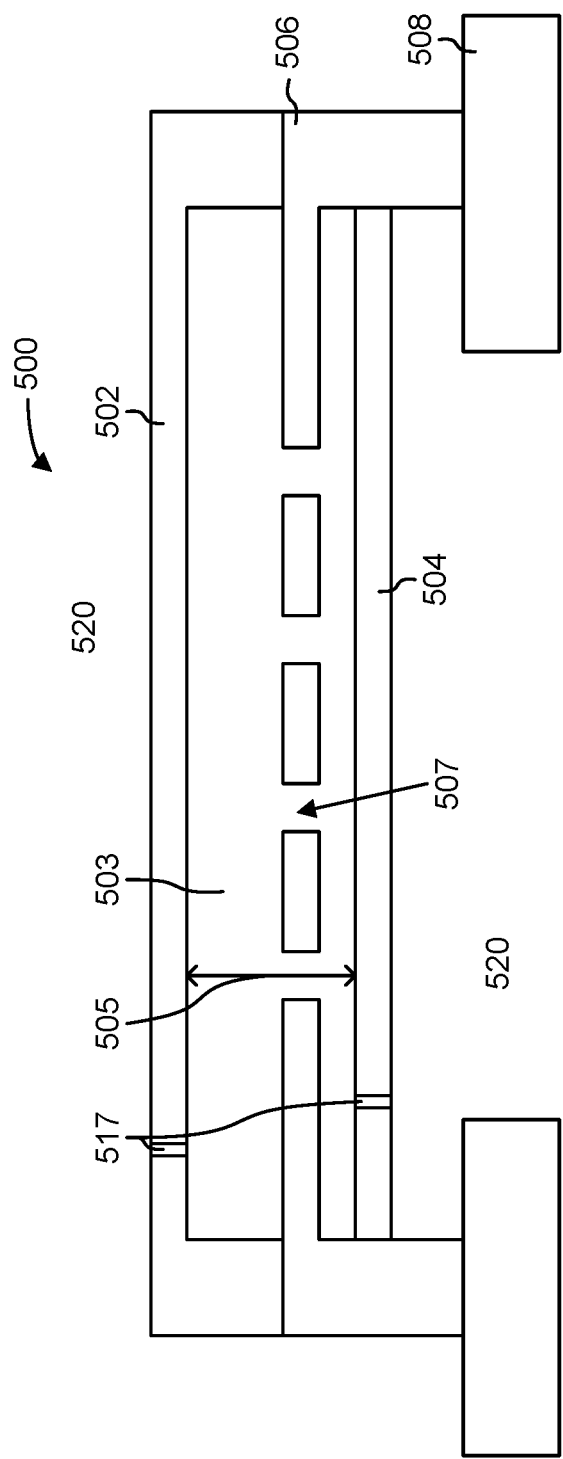
FIG. 5 is a side view of another MEMS motor according to various embodiments of the present disclosure.

Referring now to FIG. 5, a dual constrained MEMS device or motor 500 includes a first diaphragm 502, a second diaphragm 504, a back plate 506, and a substrate 508. The second diaphragm 504 is disposed in generally parallel relation to the first diaphragm 502, and the first and second diaphragms 502, 504 form an air gap 503 there between. The back plate 506 (with holes or openings 507) is disposed in the air gap 503 between and in generally parallel relation to the first diaphragm 502 and the second diaphragm 504.

The diaphragms 502, 504 may be membranes and constructed of polysilicon. The back plate 506 may be constructed of silicon nitride. The back plate 506 is biased with a voltage Vbias. As the diaphragms 502, 504 move under sound pressure, leads obtain voltage signals, which are differential signals.

The air gap 503 has a distance 505 (e.g., 3-10 microns). This distance is selected to be very small so that the stiffness of air trapped in the gap 503 is very high (above some predetermined threshold). This configuration ensures that the diaphragms 502, 504 will displace the same amount, even if the compliance of the diaphragms 502, 504 is not well matched. The total effective compliance will be the sum of the compliance of each of the diaphragms. This increased amount of compliance improves linearity, total harmonic distortion (THD), and the reliability of the microphone. Having one back plate dampens resistance, and in aspects provides one half of damping compared to previous approaches.

A vent hole 517 may pierce at least one of the first diaphragm 502 and the second diaphragm 504. The vent hole 517 is configured and sized to provide air pressure equalization between a front volume 520 and back volume 522 of the microphone in which the device 500 is deployed.

It will be appreciated that the first diaphragm 502 is mechanically coupled to the second diaphragm 504 across the air gap 503 without the use of a mechanical coupler element. In the example of FIG. 5, both diaphragms 502, 504 are constrained along their outer periphery and are not free plate diaphragms. That is, the outer periphery of the diaphragm is not free to move, but is fixed. However, it will be appreciated that one or both of the diaphragms 502, 504 may also be free plate diaphragms as described elsewhere herein.

Figure 6:
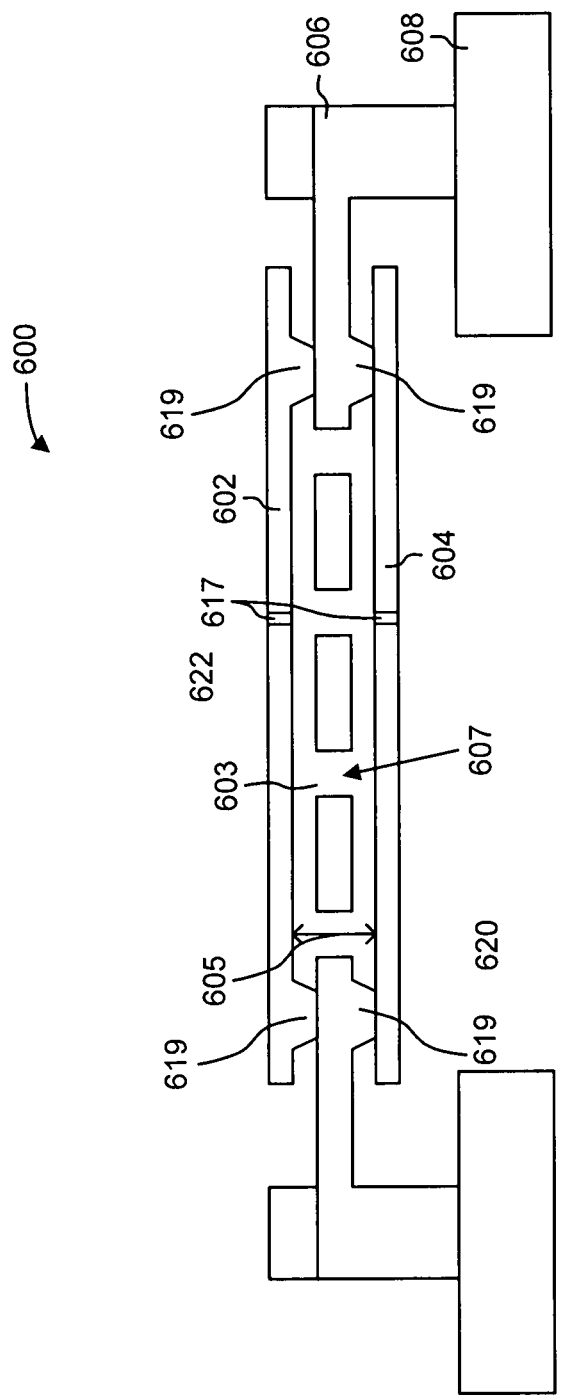
FIG. 6 is a side view of another MEMS motor according to various embodiments of the present disclosure.
Figure 7:
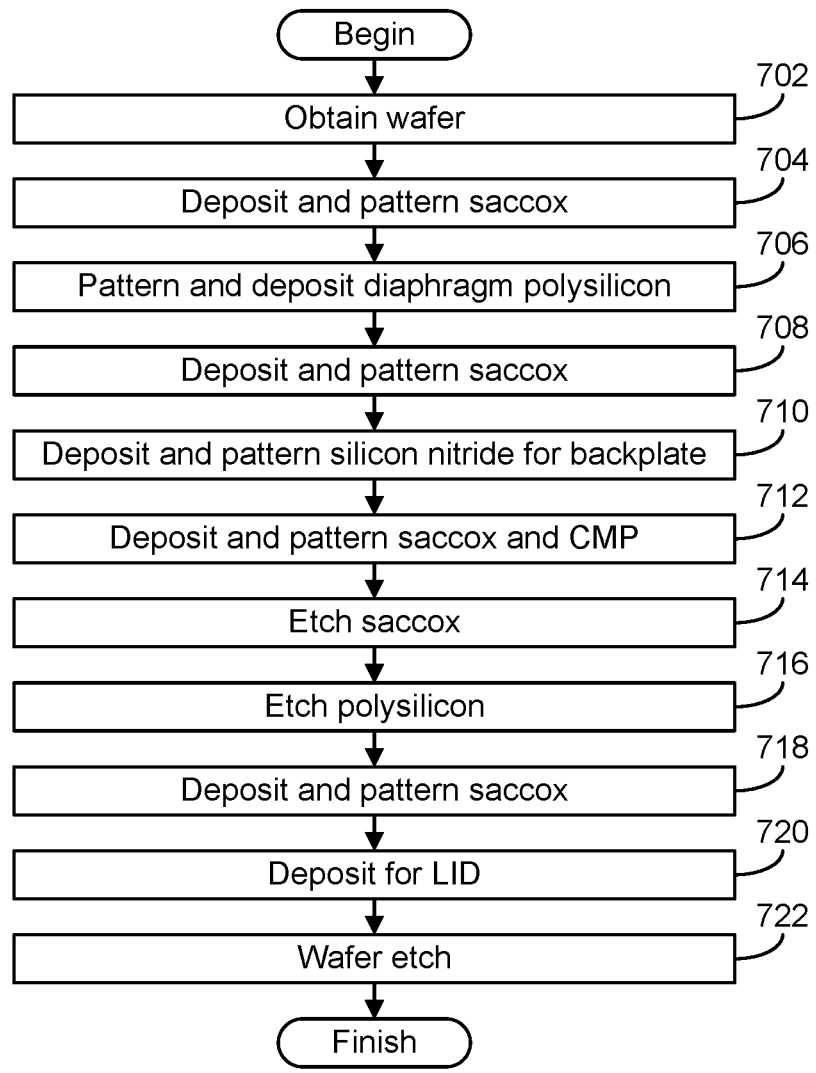
FIG. 7 is a flowchart showing one approach for constructing a MEMS motor according to various embodiments of the present disclosure.
Figure 8:
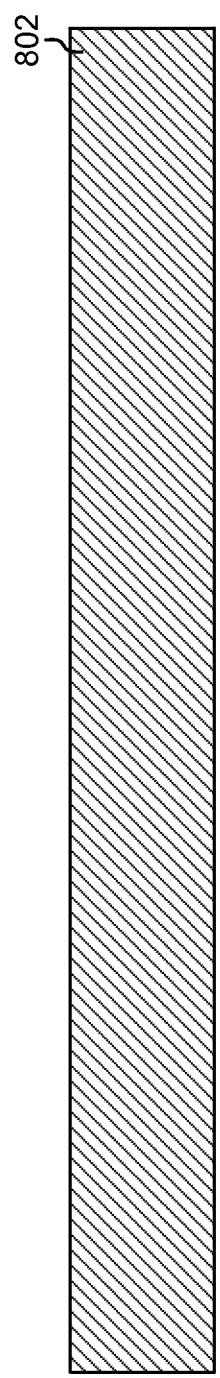
FIG. 8 is a view of a part of the MEMS motor apparatus constructed according to the approach of FIG. 7 according to various embodiments of the present disclosure.
Figure 9:
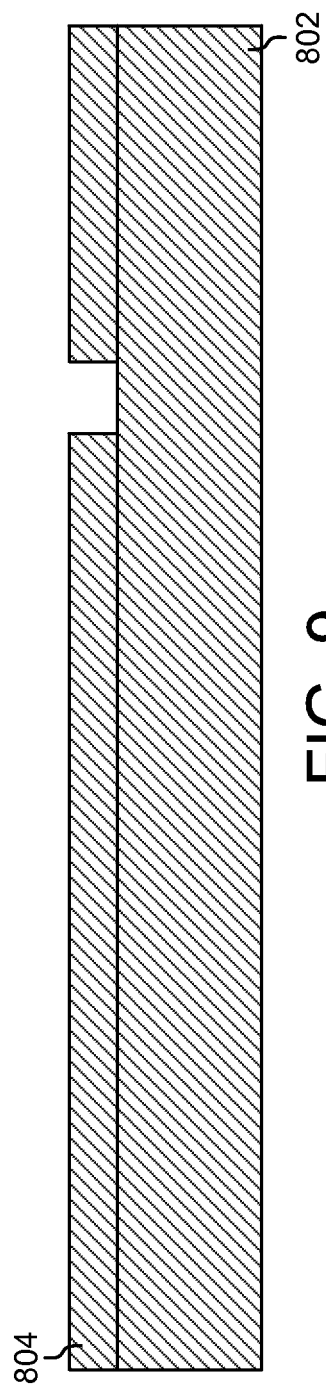
FIG. 9 is a view of a part of the MEMS motor apparatus constructed according to the approach of FIG. 7 according to various embodiments of the present disclosure.
Figure 10:
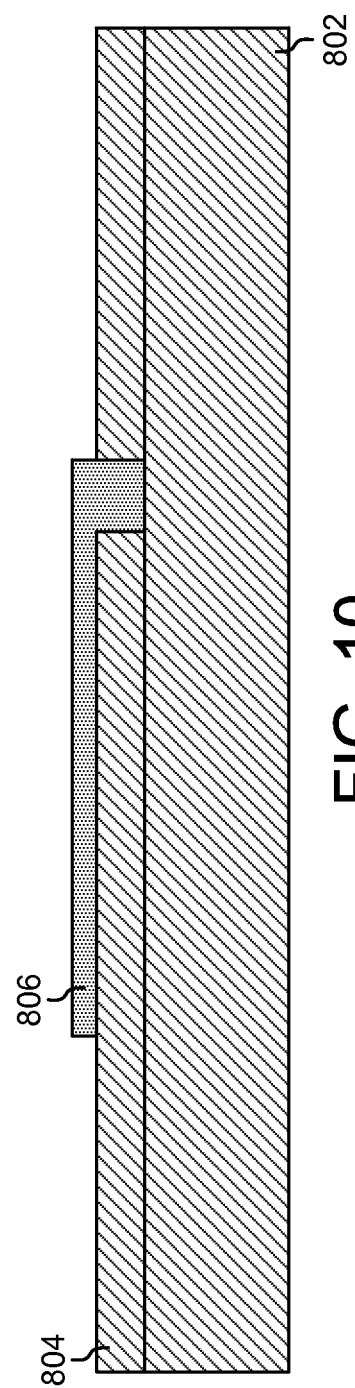
FIG. 10 is a view of a part of the MEMS motor apparatus constructed according to the approach of FIG. 7 according to various embodiments of the present disclosure.
Figure 11:
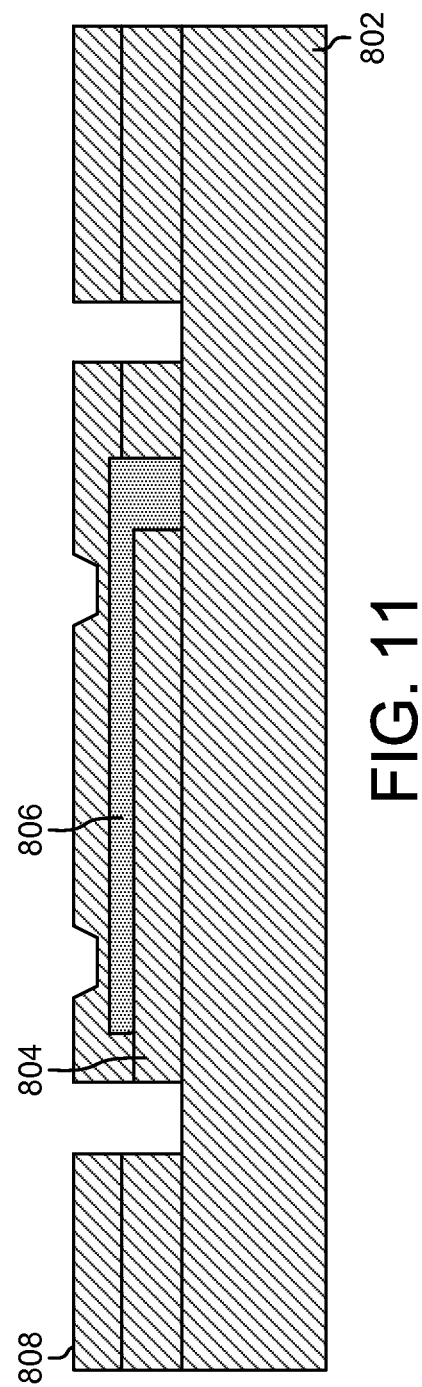
FIG. 11 is a view of a part of the MEMS motor apparatus constructed according to the approach of FIG. 7 according to various embodiments of the present disclosure.
Figure 12:
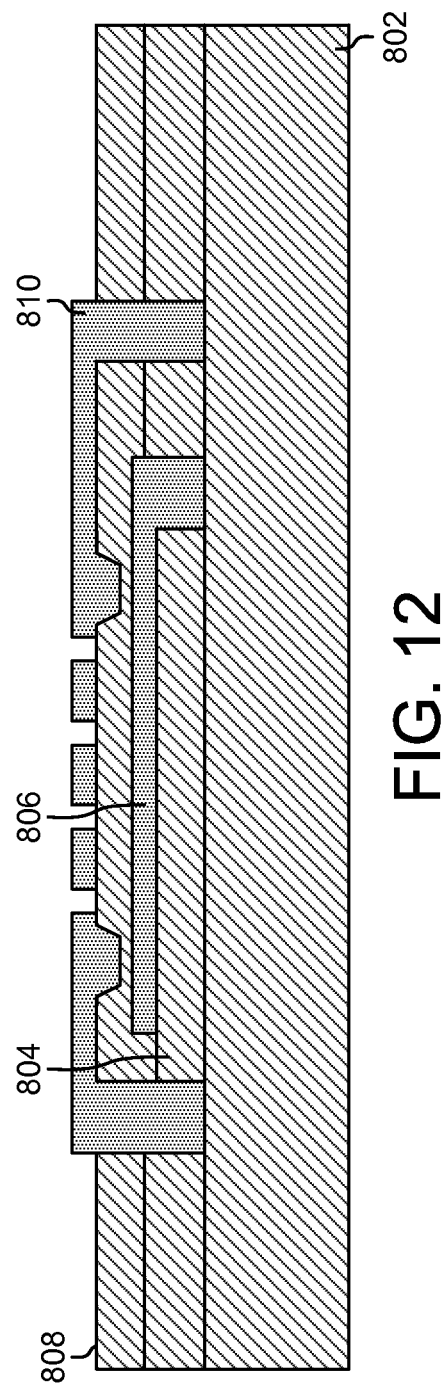
FIG. 12 is a view of a part of the MEMS motor apparatus constructed according to the approach of FIG. 7 according to various embodiments of the present disclosure.
Figure 13:
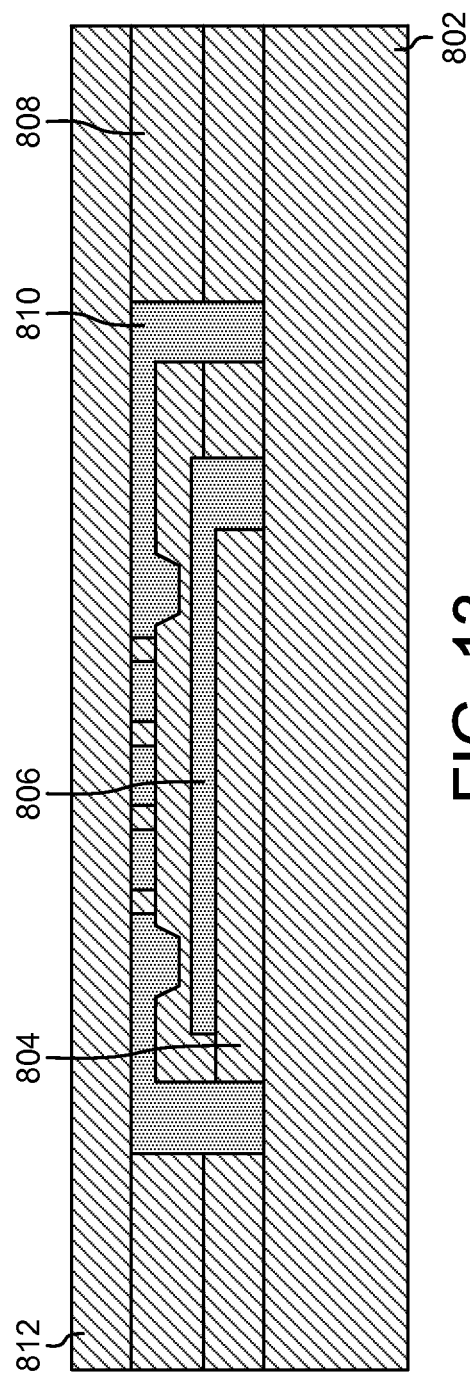
FIG. 13 is a view of a part of the MEMS motor apparatus constructed according to the approach of FIG. 7 according to various embodiments of the present disclosure.
Figure 14:
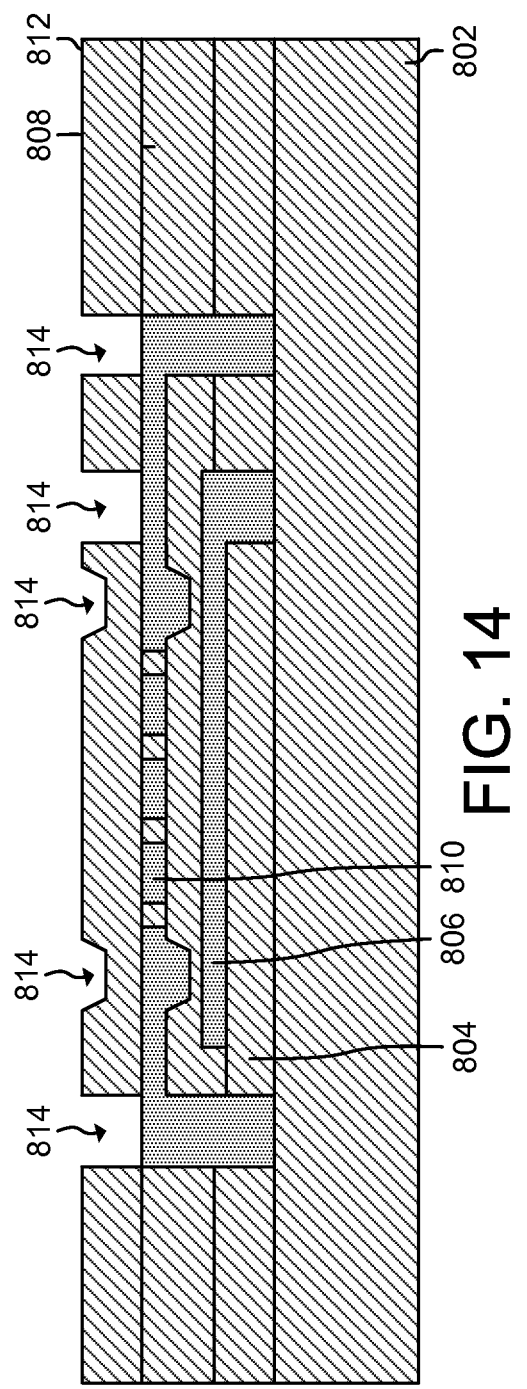
FIG. 14 is a view of a part of the MEMS motor apparatus constructed according to the approach of FIG. 7 according to various embodiments of the present disclosure.
Figure 15:
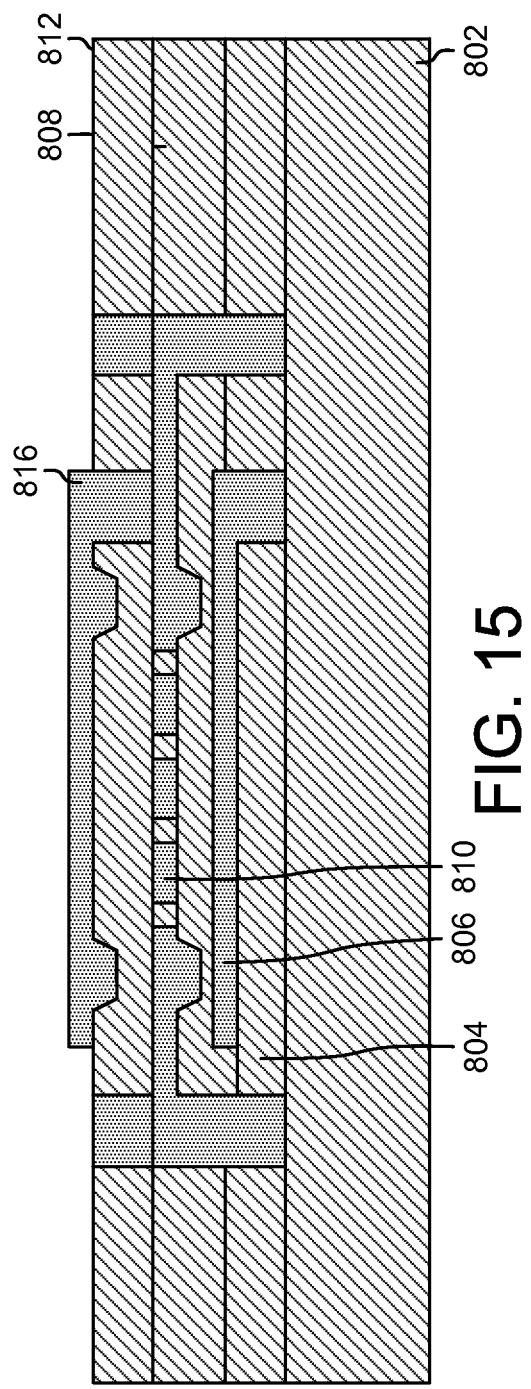
FIG. 15 is a view of a part of the MEMS motor apparatus constructed according to the approach of FIG. 7 according to various embodiments of the present disclosure.
Figure 16:
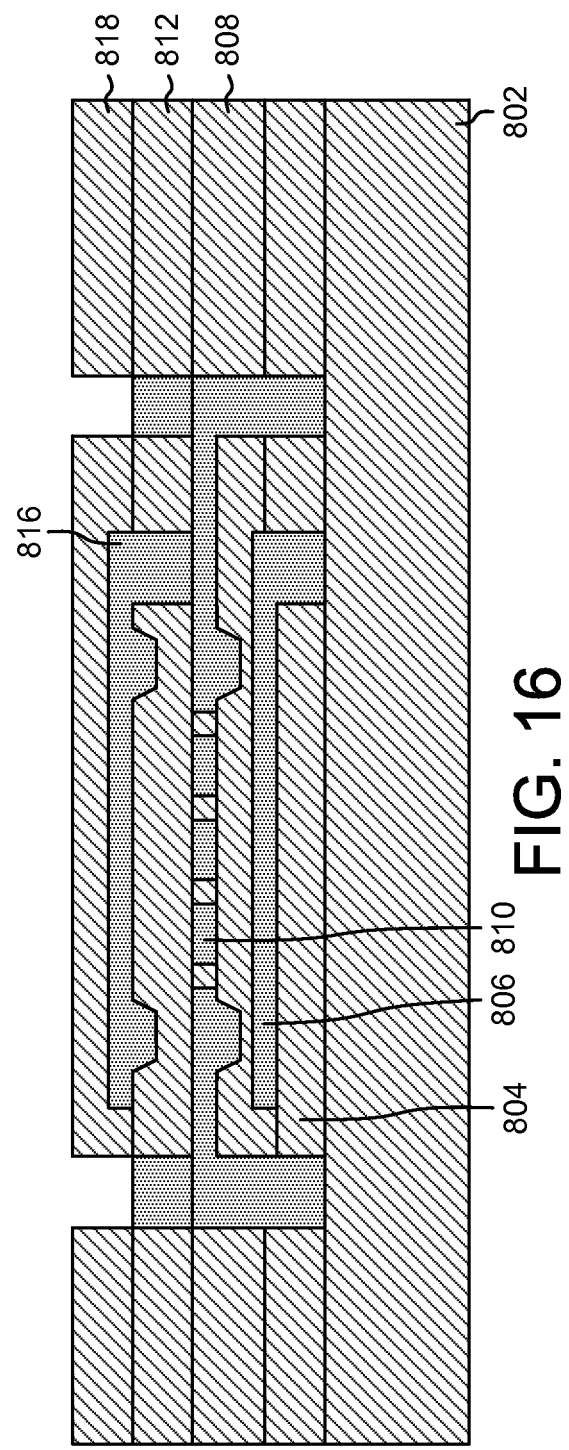
FIG. 16 is a view of a part of the MEMS motor apparatus constructed according to the approach of FIG. 7 according to various embodiments of the present disclosure.
Figure 17:
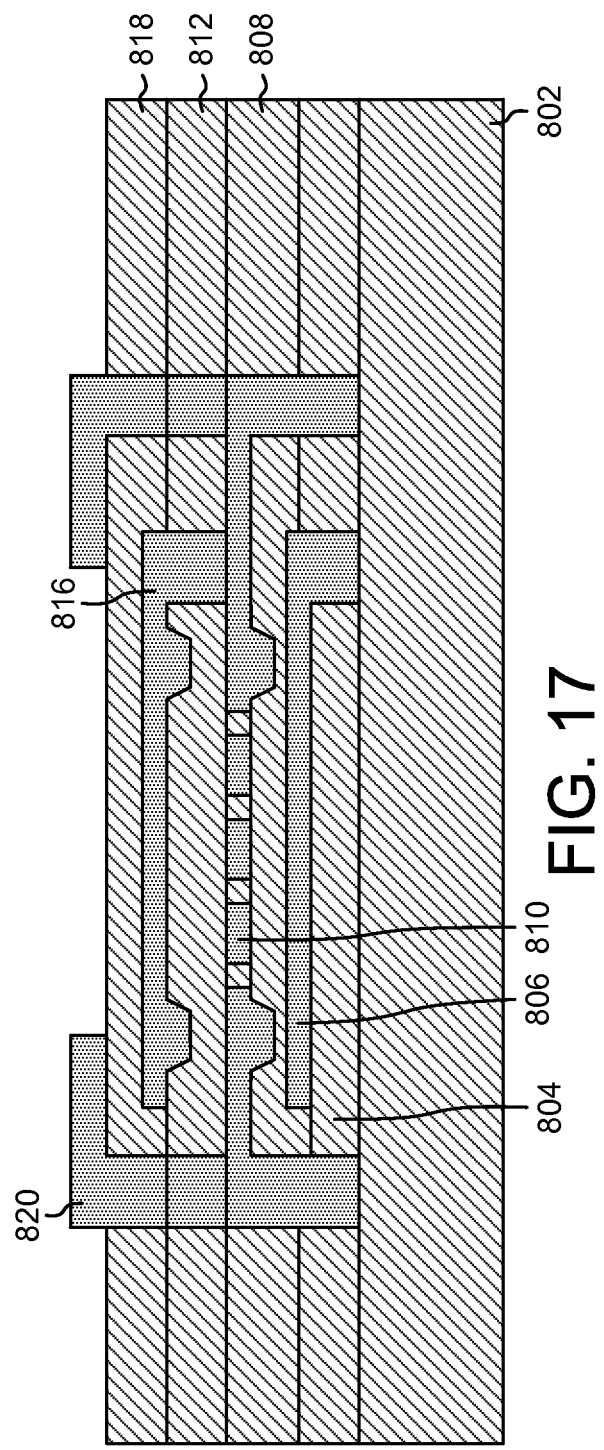
FIG. 17 is a view of a part of the MEMS motor apparatus constructed according to the approach of FIG. 7 according to various embodiments of the present disclosure.
Figure 18:
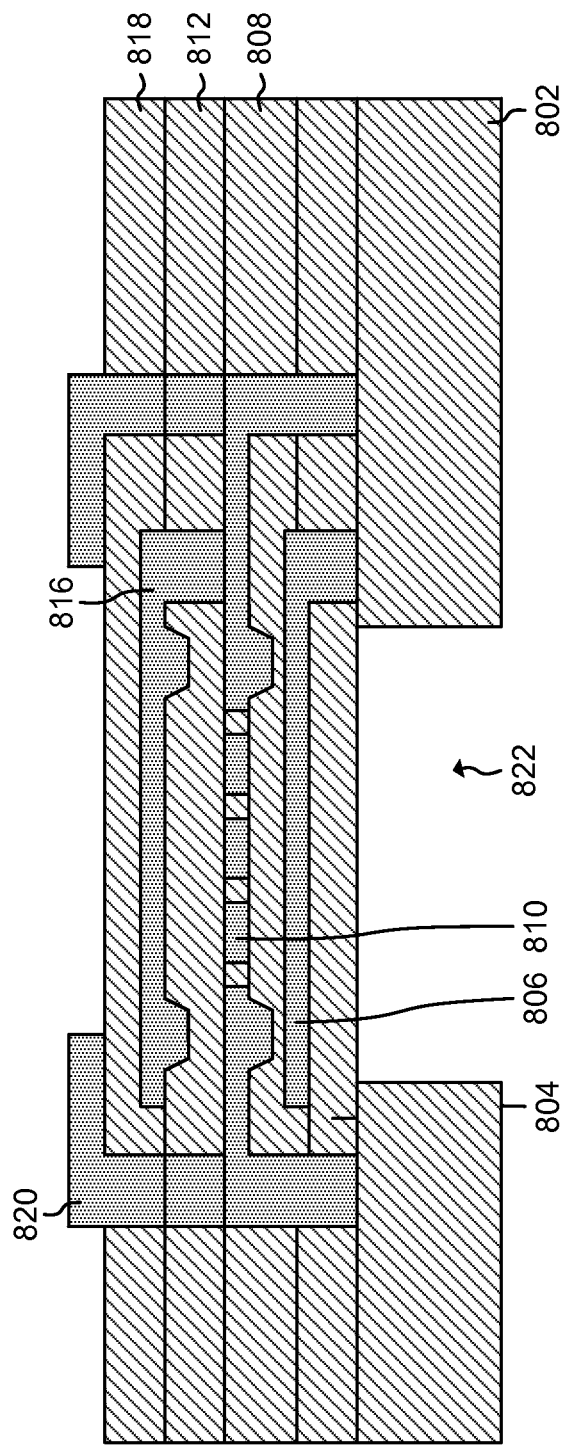
FIG. 18 is a view of a part of the MEMS motor apparatus constructed according to the approach of FIG. 7 according to various embodiments of the present disclosure.

Referring now to FIG. 6, MEMS device or motor 600 wherein the diaphragms are permanently attached or secured to posts includes a first diaphragm 602, second diaphragm 604, back plate 606, and substrate 608. The second diaphragm 604 is disposed in generally parallel relation to the first diaphragm 602, and the first and second diaphragms 602, 604 form an air gap 603 there between. The back plate 606 (with holes or openings 607) is disposed in the air gap 603 between and in generally parallel relation to the first diaphragm 602 and the second diaphragm 604.

The diaphragms 602, 604 may be membranes and constructed of polysilicon. The back plate 606 may be constructed of silicon nitride. The back plate 606 is biased with a voltage Vbias. As the diaphragms 602, 604 move under sound pressure, leads obtain voltage signals, which are differential signals.

The air gap 603 has a distance 605 (e.g., 8-10 microns). This distance is selected to be very small so that the stiffness of air trapped in the gap 603 is very high (above some predetermined threshold). This configuration ensures that the diaphragms 602, 604 will displace the same amount, even if the compliance of the diaphragms 602, 604 is not well matched. The total effective compliance will be the sum of the compliance of each of the diaphragms. This improves total harmonic distortion (THD) and the reliability of the microphone. Having one back plate dampens resistance, and in some aspects provides one half of damping compared to previous approaches.

A vent hole 617 may pierce at least one of the first diaphragm 602 and the second diaphragm 604. The vent hole 617 is configured and sized to provide air pressure equalization between a front volume 620 and back volume 622 of the microphone in which the device 600 is deployed.

It will be appreciated that the first diaphragm 602 is mechanically coupled to the second diaphragm 604 across the air gap 603 without the use of a mechanical coupler element. In the example of FIG. 6, both diaphragms 602, 604 are coupled to posts 619, which connect the diaphragm 602, 604 to the back plate 606. That is, the outer periphery of the diaphragm 602, 604 is not free to move, but is fixed because the diaphragms are fixed to the back plate 606 via the posts 619. However, it will be appreciated that one or both of the diaphragms 602, 604 may also be free plate diaphragms as described elsewhere herein.

Referring now to FIG. 7-18, a process for assembly a MEMS motor is described. It will be appreciated that this process can be used to construct the device described with respect to FIG. 4. Other processes with similar steps may be used to construct the devices of FIG. 5 and FIG. 6.

At step 702, a silicon wafer to be used for the base or substrate 802 is obtained or formed. See FIG. 8.

At step 704, saccox layer 804 is deposited and patterned on the base 802. See FIG. 9. Saccox is sacrificial silicon dioxide, which is deposited in the process of building the MEMS structure and later removed. The purpose of this step is to provide a support (i.e., the saccox) to temporary support other components being constructed.

At step 706, diaphragm polysilicon 806 for the first diaphragm is deposited and patterned on top of the saccox 804. See FIG. 10.

At step 708, another layer 808 of saccox is deposited. The purpose of layer 808 is to support the back plate as it is being constructed. See FIG. 11.

At step 710, silicon nitride layer 810 for the back plate is deposited and patterned. See FIG. 12.

At step 712, a further saccox 812 is deposited. A planarization step such as a chemical mechanical polish (CMP) may be performed on this layer to remove topology resulting from underlying layers. See FIG. 13.

At step 714, the saccox is etched at locations indicated by the arrow labeled 814. See FIG. 14.

A step 716, a diaphragm polysilicon layer 716 for the top or second diaphragm is deposited. See FIG. 15.

At step 718, a layer 718 of saccox is deposited and patterned. See FIG. 16.

At step 720, a layer of polysilicon 720 for a lid or restraint to contain or limit movement of the top diaphragm is deposited. See FIG. 17. This step may be optionally performed (i.e., the device may be formed with or without a lid or restraint).

At step 722, through-wafer etching is performed to create back hole 822. See FIG. 18. The saccox layers are removed and this removal results in the structure as shown in FIG. 4.

The herein described subject matter sometimes illustrates different components contained within, or connected with, different other components. It is to be understood that such depicted architectures are merely exemplary, and that in fact many other architectures can be implemented which achieve the same functionality.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A micro electro mechanical system (MEMS) motor, comprising,
    a first diaphragm comprising one or more posts, wherein the first diaphragm is a free plate diaphragm that is free to move within first constraints;
    a second diaphragm disposed in generally parallel relation to the first diaphragm, the first diaphragm and the second diaphragm forming an air gap there between, wherein the second diaphragm is a free plate diaphragm that is free to move within second constraints; and
    a black plate disposed in the air gap between and in generally parallel relation to the first diaphragm and the second diaphragm, wherein the first diaphragm is secured to the back plate through the one or more posts of the first diaphragm.

2. The MEMS motor of claim 1, wherein the first diaphragm and the second diaphragm are configured to move in response to sound pressure and generate differential signals.

3. The MEMS motor of claim 1, wherein the first constraints comprise posts disposed about a periphery of the first diaphragm, and wherein the second constraints comprise posts disposed about a periphery of the second diaphragm.

4. The MEMS motor of claim 1, wherein the first constraints comprise a restraining structure disposed on top of the back plate, wherein the first diaphragm is disposed between the restraining structure and the back plate, and wherein the restraining structure restrains at least some movement of the first diaphragm away from the back plate.

5. The MEMS motor of claim 1, wherein the second diaphragm is secured to the back plate through one or more posts formed on the back plate.

6. The MEMS motor of claim 1, wherein the first diaphragm is constructed of polysilicon.

7. The MEMS motor of claim 1, wherein the air gap is approximately 3-10 microns between the first diaphragm and the second diaphragm.

8. The MEMS motor of claim 1, wherein at least one of the first diaphragm or the second diaphragm has a vent hole.

9. A micro electro mechanical system (MEMS) microphone, comprising:
   a base;
   a micro electro mechanical system (MEMS) device disposed on the base, the MEMS device comprising:
      a first diaphragm comprising one or more posts;
      a second diaphragm disposed in generally parallel relation to the first diaphragm, the first diaphragm and the second diaphragm forming an air gap there between; and
      a back plate disposed in the air gap between and in generally parallel relation to the first diaphragm and the second diaphragm, wherein the one or more posts of the first diaphragm are structured to limit movement of the first diaphragm with respect to the back plate;
   a lid coupled to the base and enclosing the MEMS device;
   wherein a port extends through either the base or the lid, and wherein an outer periphery of the first diaphragm is secured to the back plate and an outer periphery of the second diaphragm is secured to the base.

10. The MEMS microphone of claim 9, wherein the first diaphragm and the second diaphragm are configured to move in response to sound pressure and generate differential signals.

11. The MEMS microphone of claim 9, wherein the first diaphragm is constrained along an outer periphery of the first diaphragm, and wherein the second diaphragm is constrained along an outer periphery of the second diaphragm.

12. The MEMS microphone of claim 9, wherein the first diaphragm is constructed of polysilicon.

13. The MEMS microphone of claim 9, wherein the air gap is approximately 3-10 microns between the first diaphragm and the second diaphragm.

14. The MEMS microphone of claim 9, wherein at least one of the first diaphragm and the second diaphragm has a vent hole.

* * * * *